(12) United States Patent
Sjogren et al.

(10) Patent No.: US 11,277,128 B1
(45) Date of Patent: Mar. 15, 2022

(54) HIGH CURRENT SOLID-STATE BIDIRECTIONAL RELAY

(71) Applicant: Switch Gear Automotive LLC, Park City, UT (US)

(72) Inventors: Allen Erik Sjogren, Park City, UT (US); Elliot Mitchell Berg, Salt Lake City, UT (US)

(73) Assignee: SWITCH GEAR AUTOMOTIVE LLC, Park City, UT (US)

( * ) Notice: Subject to any disclaimer, the term of this patent is extended or adjusted under 35 U.S.C. 154(b) by 0 days.

(21) Appl. No.: 17/089,169

(22) Filed: Nov. 4, 2020

(51) Int. Cl.
| | |
|---|---|
| *H05K 1/02* | (2006.01) |
| *H03K 17/687* | (2006.01) |
| *H01L 25/07* | (2006.01) |
| *H01L 23/50* | (2006.01) |
| *H05K 1/09* | (2006.01) |
| *H05K 1/18* | (2006.01) |

(52) U.S. Cl.
CPC ......... *H03K 17/6871* (2013.01); *H01L 23/50* (2013.01); *H01L 25/072* (2013.01); *H05K 1/09* (2013.01); *H05K 1/181* (2013.01); *H05K 2201/10128* (2013.01); *H05K 2201/10166* (2013.01)

(58) Field of Classification Search
CPC ...... H05K 1/0203; H05K 1/0263; H05K 1/09; H05K 1/144; H05K 1/181–183; H05K 3/202; H05K 9/026; H02M 1/00
USPC ................. 361/775–784, 144–152; 439/76.2
See application file for complete search history.

(56) References Cited

U.S. PATENT DOCUMENTS

| | | | | |
|---|---|---|---|---|
| 5,347,157 A | * | 9/1994 | Hung | C30B 23/02 |
| | | | | 257/627 |
| 6,212,087 B1 | * | 4/2001 | Grant | H02M 7/003 |
| | | | | 361/707 |
| 7,167,377 B2 | * | 1/2007 | Onizuka | H05K 1/0263 |
| | | | | 361/772 |
| 7,522,405 B2 | | 4/2009 | Fogleman | |
| 7,826,231 B2 | * | 11/2010 | Yamabuchi | H05K 7/1432 |
| | | | | 361/775 |
| 9,853,378 B2 | * | 12/2017 | Kim | H01R 12/7088 |

(Continued)

OTHER PUBLICATIONS

Panguloori, Rakesh, Achieve Bidirectional Control and Protection Through Back-to-Back Connected eFuse Devices, Texas Instruments Application Report, SLVA948-Dec. 2017.

*Primary Examiner* — Tuan T Dinh
(74) *Attorney, Agent, or Firm* — Kirton McConkie; Evan R. Witt (57) ABSTRACT

A high current solid-state bidirectional relay assembly includes a first conductor bar, a second conductor bar, and a third intermediate conductor bar. A plurality of MOSFET switching elements are disposed in two back-to-back arrays of switching elements. Either all of the source leads or all of the drain leads of the plurality of MOSFET switching element are electrically connected to the third intermediate conductor bar. The other leads of each MOSFET switching element in one of the arrays are electrically connected to the first conductor bar, and the other leads of each MOSFET switching element in the other array are electrically connected to the second conductor bar. A printed circuit board has control circuitry to control the bidirectional relay. All of the gate leads of the plurality of MOSFET switching elements are electrically connected to the control circuitry of the printed circuit board.

20 Claims, 8 Drawing Sheets

(56) References Cited

U.S. PATENT DOCUMENTS

| | | | |
|---|---|---|---|
| 10,373,892 B2 | 8/2019 | Vellaiyanaicken et al. | |
| 2001/0045777 A1* | 11/2001 | Onizuka | H05K 1/144 |
| | | | 307/10.6 |
| 2009/0098748 A1* | 4/2009 | Ikeda | H01R 9/2425 |
| | | | 439/76.1 |
| 2016/0141770 A1* | 5/2016 | Hoehn | H01R 4/34 |
| | | | 361/747 |
| 2016/0172995 A1* | 6/2016 | Obiraki | H01L 25/162 |
| | | | 361/728 |

\* cited by examiner

HIGH CURRENT SOLID-STATE BIDIRECTIONAL RELAY

BACKGROUND OF THE INVENTION

The present disclosure relates to a high current solid-state bidirectional relay assembly. More specifically, the disclosed invention provides a low resistance current path for a solid-state bidirectional relay that is separate from the printed circuit control board.

The disclosed invention uses MOSFETs (metal oxide semiconductor field effect transistors) aligned in a back-to-back configuration, creating a bidirectional MOSFET relay. In a MOSFET bidirectional relay there is an intermediate connection in between the two MOSFET source leads or the two MOSFET drain leads. Typically, this back-to-back connection is done via a soldered printed circuit board (PCB). For high-current applications, specialized expensive PCBs are used to provide a low-resistance path, either through heavy copper cladding, or via boards with copper busses laminated within common FR4 (flame resistant woven glass reinforced epoxy resin) PCB material. Due to the construction of these specialized PCBs, they typically have a higher resistance and limited total current handling capability.

It would be an advancement in the art to provide a solid-state bidirectional relay assembly using back-to-back MOSFETs in which no current flows through the PCB.

It would be an advancement in the art to provide a solid-state bidirectional relay assembly using back-to-back MOSFETs in which all current flow between the back-to-back MOSFETs is through an intermediate conductor bar.

It would be an advancement in the art to provide a solid-state bidirectional relay assembly which is scalable to operate under various high current conditions.

BRIEF SUMMARY OF THE INVENTION

The present disclosure relates generally to a high current solid-state bidirectional relay assembly. One potential application of the disclosed bidirectional relay assembly is as a battery isolator to isolate one battery from another battery or to isolate one battery from many batteries in a vehicle. For example, the isolation allows using the secondary battery or batteries to power any load without discharging the main battery. The main battery is kept isolated from the load to be able to start the vehicle. When the vehicle is running the isolator connects the secondary battery to the charging device. The isolation is achieved through the solid-state bidirectional relay assembly. The disclosed solid-state bidirectional relay assembly may be used in a variety of vehicles including, but not limited to, campers, trailers, boats, off road vehicles, emergency vehicles, and aircraft.

Various embodiments are described herein. It will be understood that the embodiments listed below may be combined not only as listed below, but in other suitable combinations in accordance with the scope of the invention.

One or more disclosed embodiments of the solid-state bidirectional relay include a first conductor bar, a second conductor bar, and a third intermediate conductor bar. The first conductor bar may have a first surface and an opposite second surface. The second conductor bar may have a first surface and an opposite second surface. The third intermediate conductor bar may have a first surface and an opposite second surface.

In one or more disclosed embodiments, the first conductor bar, the second conductor bar, and the third intermediate conductor bar are disposed in a substantially coplanar configuration. In one or more disclosed embodiments, the third intermediate conductor bar is disposed between the first conductor bar and the second conductor bar.

In one or more disclosed embodiments, the first conductor bar, the second conductor bar, and the third intermediate conductor bar are fabricated of a conductive metallic material. Any suitable conductive metallic material may be used provided it conducts high current, such as greater than 50 amperes, at very low resistance. As used herein, the term "high current" includes a current greater than 50 amperes. As used herein, the term "low resistance" includes a resistance less than 1 milliohm.

In one or more disclosed embodiments, the resistance of the first conductor bar, the second conductor bar, and the third conductor bar is less than 1 milliohm. In one or more disclosed embodiments, the resistance of the first conductor bar, the second conductor bar, and the third conductor bar is less than 100 microohm. In one or more disclosed embodiments, the resistance of the first conductor bar, the second conductor bar, and the third conductor bar is less than 50 microohm. In one or more disclosed embodiments, the resistance of the first conductor bar, the second conductor bar, and the third conductor bar is less than 20 microohm. In one or more disclosed embodiments, the conductive metallic material is selected from copper, brass, bronze, nickel, magnesium, silver, platinum, gold, zinc, or aluminum.

One or more disclosed embodiments of the solid-state bidirectional relay include a plurality of metal oxide semiconductor field effect transistor (MOSFET) switching elements disposed in two or more arrays of switching elements. Each MOSFET switching element comprises a source lead, a drain lead, and a gate lead. One or more disclosed embodiments of the solid-state bidirectional relay include a first array of MOSFET switching elements and a second array of MOSFET switching elements.

The first array of MOSFET switching elements and second array of MOSFET switching elements are configured in a back-to-back configuration. That is, source leads for the MOSFET switching elements of the first array are electrically connected to the source leads for the MOSFET switching elements of the second array. Alternatively, the drain leads for the MOSFET switching elements of the first array are electrically connected to the drain leads for the MOSFET switching elements of the second array.

In one embodiment the source lead of each MOSFET switching element in the first array and second array is electrically connected to the first surface of the third intermediate conductor bar. That is, the back-to-back MOSFET switching elements share a common source. The drain lead of each MOSFET switching element in the first array is electrically connected to the first surface of the first conductor bar, and the drain lead of each MOSFET switching element in the second array is electrically connected to the first surface of the second conductor bar.

In another embodiment the drain lead of each MOSFET switching element in the first array and second array is electrically connected to the first surface of the third intermediate conductor bar. That is, the back-to-back MOSFET switching elements share a common drain. The source lead of each MOSFET switching element in the first array is electrically connected to the first surface of the first conductor bar, and the source lead of each MOSFET switching element in the second array is electrically connected to the first surface of the second conductor bar.

One or more disclosed embodiments of the solid-state bidirectional relay include a third array of MOSFET switching elements and a fourth array of MOSFET switching elements connected to the second surfaces of the first, second, and intermediate conductor bars.

In one embodiment the source lead of each MOSFET switching element in the third array and fourth array is electrically connected to the second surface of the third intermediate conductor bar. That is, the back-to-back MOSFET switching elements share a common source. The drain lead of each MOSFET switching element in the third array is electrically connected to the second surface of the first conductor bar, and the drain lead of each MOSFET switching element in the fourth array is electrically connected to the second surface of the second conductor bar.

In another embodiment the drain lead of each MOSFET switching element in the third array and fourth array is electrically connected to the second surface of the third intermediate conductor bar. That is, the back-to-back MOSFET switching elements share a common drain. The source lead of each MOSFET switching element in the third array is electrically connected to the second surface of the first conductor bar, and the source lead of each MOSFET switching element in the fourth array is electrically connected to the second surface of the second conductor bar.

One or more disclosed embodiments of the solid-state bidirectional relay include a printed circuit board comprising control circuitry to provide control of the bidirectional relay. The gate lead of each MOSFET switching element is electrically connected to the control circuitry of the printed circuit board.

In one or more disclosed embodiments of the solid-state bidirectional relay, the plurality of MOSFET switching elements are divided between the first array of switching elements and the second array of switching elements. The MOSFET switching elements may be equally divided or unequally divided. The individual MOSFET switching elements may be the same or different.

In one or more disclosed embodiments of the solid-state bidirectional relay, the number of MOSFET switching elements is selected to provide a continuous current capacity in the range of 50 to 1000 amperes.

In one or more disclosed embodiments of the solid-state bidirectional relay, the number of MOSFET switching elements is selected to provide a continuous current capacity in the range of 100 to 500 amperes.

In one or more disclosed embodiments of the solid-state bidirectional relay, the number of MOSFET switching elements is selected to provide a continuous current capacity in the range of 200 to 300 amperes.

One or more disclosed embodiments of the solid-state bidirectional relay include standoffs affixed to the first conductor bar, the second conductor bar, and the intermediate conductor bar. The printed circuit board is affixed to the standoffs and spaced from the first conductor bar, second conductor bar, and third intermediate conductor bar.

In one or more disclosed embodiment of the solid-state bidirectional relay, at least one standoff affixed to the first conductor bar is conductive, at least one standoff affixed to the second conductor bar is conductive, and at least one standoff affixed to the intermediate conductor bar is conductive. The printed circuit board may comprise operational circuitry connected to the conductive standoffs to sense a MOSFET voltage drop between the first conductor bar and second conductor bar and to determine a current flow through the bidirectional relay assembly.

In one or more disclosed embodiments of the solid-state bidirectional relay, the first conductor bar comprises a first terminal extension and the second conductor bar comprise a second terminal extension. The first and second terminal extensions facilitate connection to an electric power source, such as a battery or battery charger, or load. The first and second terminal extensions may be at any angle relative to the first and second conductor bars. In one non-limiting embodiment, the first terminal extension is disposed at a 90° angle relative to the first conductor bar. In one non-limiting embodiment, the second terminal extension is disposed at a 90° angle relative to the second conductor bar.

One or more disclosed embodiments of the solid-state bidirectional relay include a temperature sensor to sense a temperature of the plurality of MOSFETs. The temperature sensor may be connected to operational circuitry to calculate a MOSFET resistance based on MOSFET temperature.

One or more disclosed embodiments of the solid-state bidirectional relay include a control interface connected to the printed circuit board. The control interface may comprise a remote display to visually present information regarding operation of the bidirectional relay assembly. The control interface may comprise a user input connected to the control circuitry to control operation of the bidirectional relay.

It is to be understood that both the foregoing general description and the following detailed description are examples and explanatory and are not restrictive of the invention, as claimed. It should be understood that the various embodiments are not limited to the arrangements and instrumentality shown in the drawings. It should also be understood that the embodiments may be combined, or that other embodiments may be utilized and that structural changes, unless so claimed, may be made without departing from the scope of the various embodiments of the present invention. The following detailed description is, therefore, not to be taken in a limiting sense.

BRIEF DESCRIPTION OF THE SEVERAL DRAWINGS

In order that the manner in which the above-recited and other features and advantages of the invention are obtained and will be readily understood, a more particular description of the invention briefly described above will be rendered by reference to specific embodiments thereof that are illustrated in the appended drawings. Understanding that the drawings depict only typical embodiments of the invention and are not therefore to be considered to be limiting of its scope, the invention will be described and explained with additional specificity and detail.

DETAILED DESCRIPTION OF THE INVENTION

Reference throughout this specification to "one embodiment," "an embodiment," or similar language means that a particular feature, structure, or characteristic described in connection with the embodiment is included in at least one embodiment of the present invention. Thus, appearances of the phrases "in one embodiment," "in an embodiment," and similar language throughout this specification may, but do not necessarily, all refer to the same embodiment. Additionally, while the following description refers to several embodiments and examples of the various components and processes of the described invention, all of the described embodiments and examples are to be considered, in all respects, as illustrative only and not as being limiting in any manner.

Furthermore, the described features, structures, characteristics, processes, or methods of the invention may be combined in any suitable manner in one or more embodiments.

Figure 1:
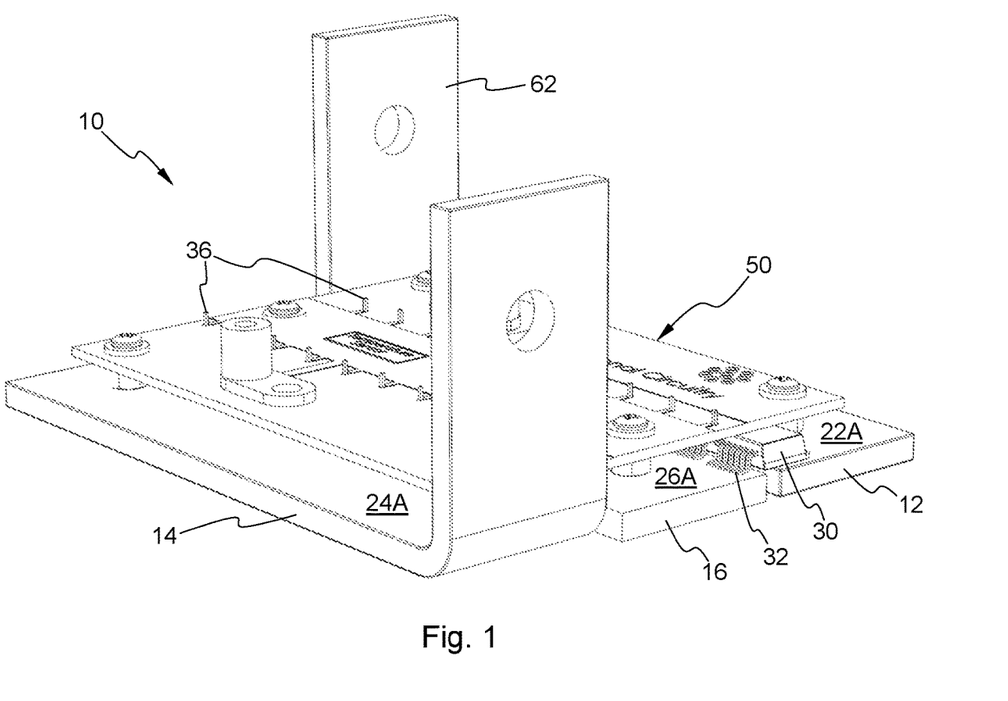
FIG. 1 is a perspective view of a high current, solid-state bidirectional relay assembly within the scope of the disclosed invention.

FIG. 1 discloses a solid-state bidirectional relay 10. The solid-state bidirectional relay 10 includes a first conductor bar 12, a second conductor bar 14, and a third intermediate conductor bar 16. The third intermediate conductor bar 16 may be disposed between the first conductor bar 12 and the second conductor bar 14.

Figure 3:
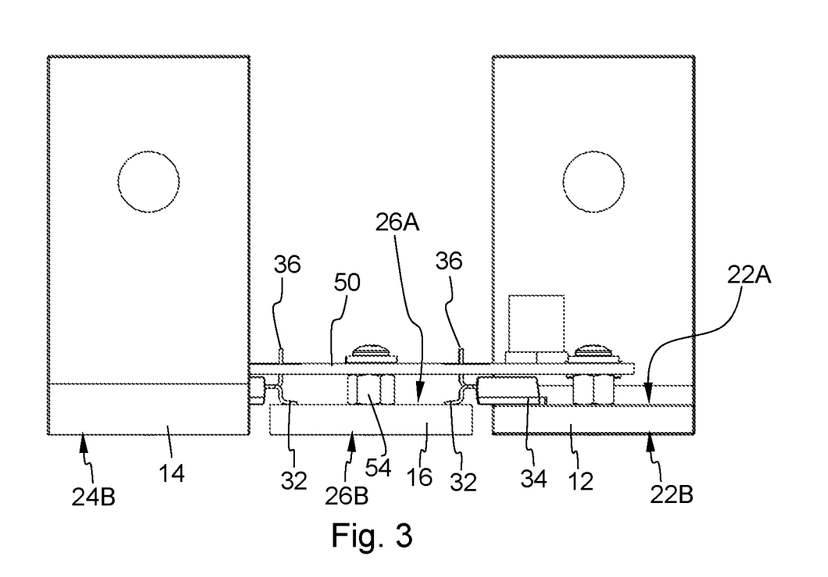
FIG. 3 is a side view of the high current, solid-state bidirectional relay assembly shown in FIG. 1, showing MOSFET switching elements positioned between the conductor bars and the printed circuit board.

The conductor bars may be fabricated to have two generally flat opposing surfaces. As shown in FIGS. 1 and 3, the first conductor bar 12 has a first surface 22A and an opposite second surface 22B. The second conductor bar 14 may have a first surface 24A and an opposite second surface 24B. The third intermediate conductor bar 16 may have a first surface 26A and an opposite second surface 26B.

The first conductor bar 12, the second conductor bar 14, and the third intermediate conductor bar 16 may be disposed in a substantially coplanar configuration. As used herein, the term "substantially coplanar" means that the first surfaces 22A, 24A of the first and second conductor bars 12, 14 are aligned in a parallel, coplanar configuration such that there is no more than a ±0.2 inch rise or depression of the first surfaces 22A, 24A of first and second conductor bars 12, 14 relative to the first surface 26A of the third intermediate conductor bar 16.

While the embodiments shown in the figures have substantially coplanar conductor bars, it will be understood that intermediate conductor bar may be bent relative to the first and second conductor bars and have a cross-sectional profile that is L-shaped or U-shaped. In such an embodiment, the conductor bars are not substantially coplanar.

The first conductor bar 12, the second conductor bar 14, and the third intermediate conductor bar 16 are fabricated of a conductive metallic material. Any suitable conductive metallic material may be used provided it conducts high current at very low resistance. As used herein, the term "high current" includes a current greater than 50 amperes. As used herein, the term "low resistance" includes a resistance measured from furthest points less than 1 milliohm.

The resistance of the first conductor bar 12, the second conductor bar 14, and the third intermediate conductor bar 16, measured from furthest points, is less than 1 milliohm. In one or more disclosed embodiments, the resistance of the first conductor bar 12, the second conductor bar 14, and the third intermediate conductor bar 16, measured from furthest points, is less than 100 microohm. In one or more disclosed embodiments, the resistance of the first conductor bar 12, the second conductor bar 14, and the third intermediate conductor bar 16, measured from furthest points, is less than 50 microohm. In one or more disclosed embodiments, the resistance of the first conductor bar 12, the second conductor bar 14, and the third intermediate conductor bar 16, measured from furthest points, is less than 20 microohm.

In one or more disclosed embodiments, the conductive metallic material is selected from copper, brass, bronze, nickel, magnesium, silver, platinum, gold, zinc, or aluminum.

Figure 2:
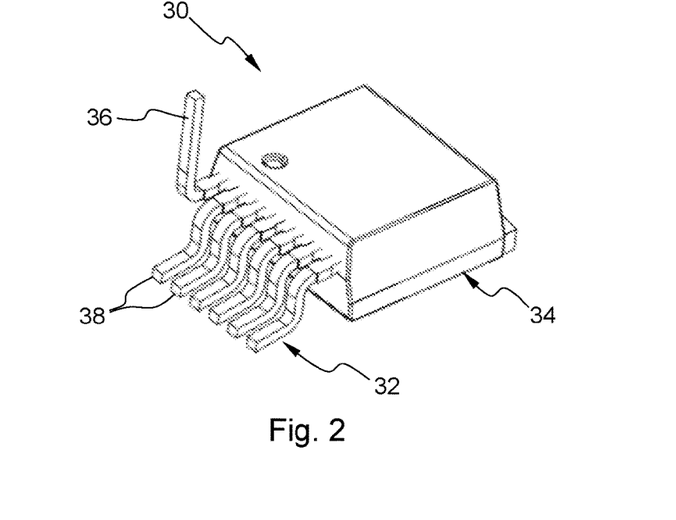
FIG. 2 is a perspective view of a metal oxide semiconductor field effect transistor (MOSFET) switching element solid-state device showing source, drain, and gate leads.

The disclosed solid-state bidirectional relay 10 includes a plurality of metal oxide semiconductor field effect transistor (MOSFET) switching elements. A representative example of a MOSFET switching element 30 is shown in FIG. 2. Each MOSFET switching element 30 comprises a source lead 32, a drain lead 34, and a gate lead 36. As shown in FIG. 2, the source lead 32 may comprise a plurality of source pins 38.

MOSFET switching elements when "on" allow current in either direction with an essentially identical $R_{DS(on)}$. $R_{DS(on)}$ is the "drain-source on resistance," or the total resistance between the drain and source of a MOSFET switching element when the MOSFET is "on." When off MOSFET switching elements block current in one direction.

Figure 5:
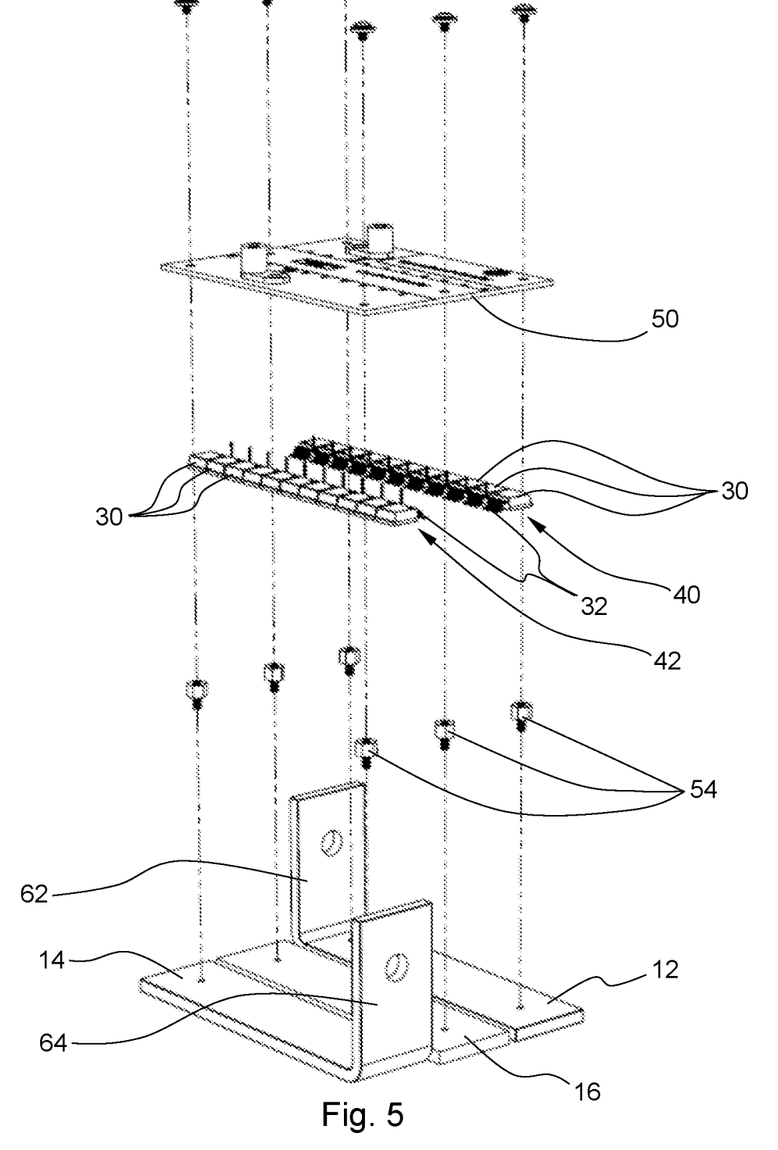
FIG. 5 is an exploded perspective view of the high current, solid-state bidirectional relay assembly shown in FIG. 1.

The plurality of MOSFET switching elements may be disposed in two or more arrays of switching elements. FIG. 5 discloses the plurality of MOSFET switching elements 30 disposed in first array 40 of MOSFET switching elements and a second array 42 of MOSFET switching elements. In the embodiment shown in FIG. 5, the first array 40 of MOSFET switching elements and second array 42 of MOSFET switching elements are configured in a back-to-back configuration. That is, source leads 32 for the MOSFET switching elements of the first array 40 are electrically connected to the source leads 32 for the MOSFET switching elements of the second array 42 through the third intermediate conductor bar 16.

In the embodiment shown in FIGS. 1, 3, 4, and 5, the source lead 32 of each MOSFET switching element in the first array 40 and second array 42 is electrically connected to the first surface 26A of the third intermediate conductor bar 16. That is, the back-to-back MOSFET switching elements share a common source. The drain lead 34 of each MOSFET switching element in the first array 40 is electrically connected to the first surface 22A of the first conductor bar 12, and the drain lead 34 of each MOSFET switching element in the second array 42 is electrically connected to the first surface 24A of the second conductor bar 14.

Figure 8:
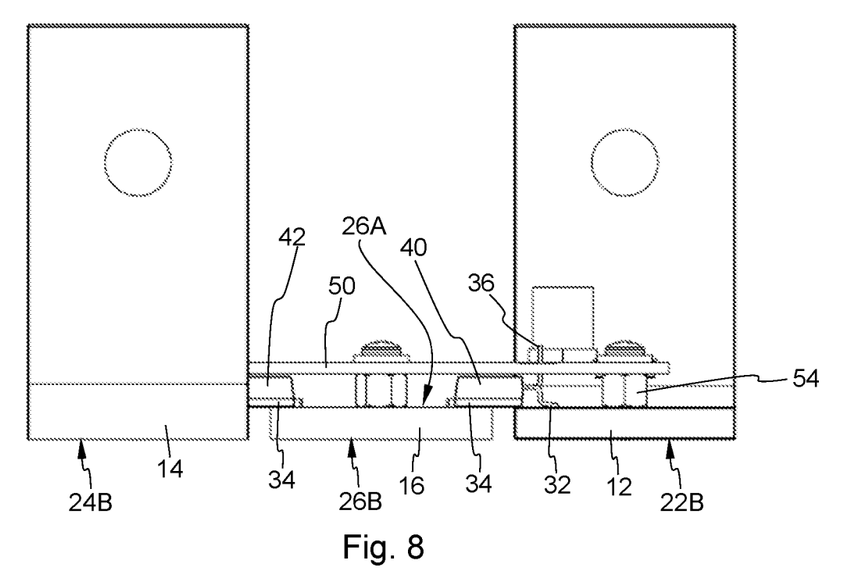
FIG. 8 is a side view showing an alternative back-to-back MOSFET switching element configuration in a high current, solid-state bidirectional relay assembly within the scope of the disclosed invention.

In another embodiment shown in FIG. 8, the drain lead 34 of each MOSFET switching element in the first array 40 and second array 42 is electrically connected to the first surface 26A of the third intermediate conductor bar 16. That is, the back-to-back MOSFET switching elements share a common drain. The source lead 32 of each MOSFET switching element in the first array 40 is electrically connected to the first surface 22A of the first conductor bar 12, and the source lead 32 of each MOSFET switching element in the second array 42 is electrically connected to the first surface 24A of the second conductor bar 14.

Figure 9:
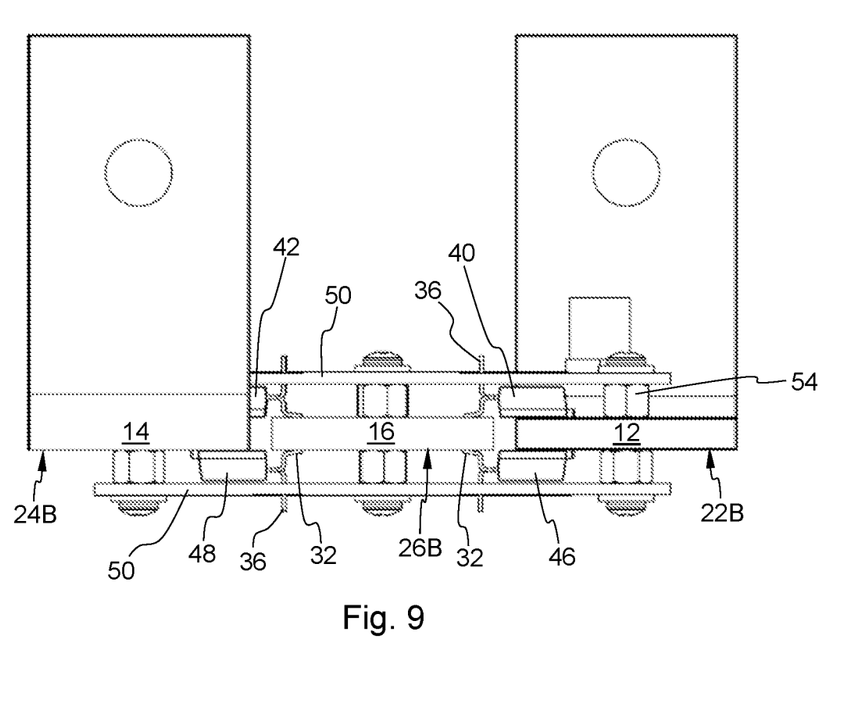
FIG. 9 is a side view showing an embodiment of the high current, solid-state bidirectional relay assembly having additional arrays of MOSFET switching elements on the bottom surfaces of the conductor bars.
Figure 10:
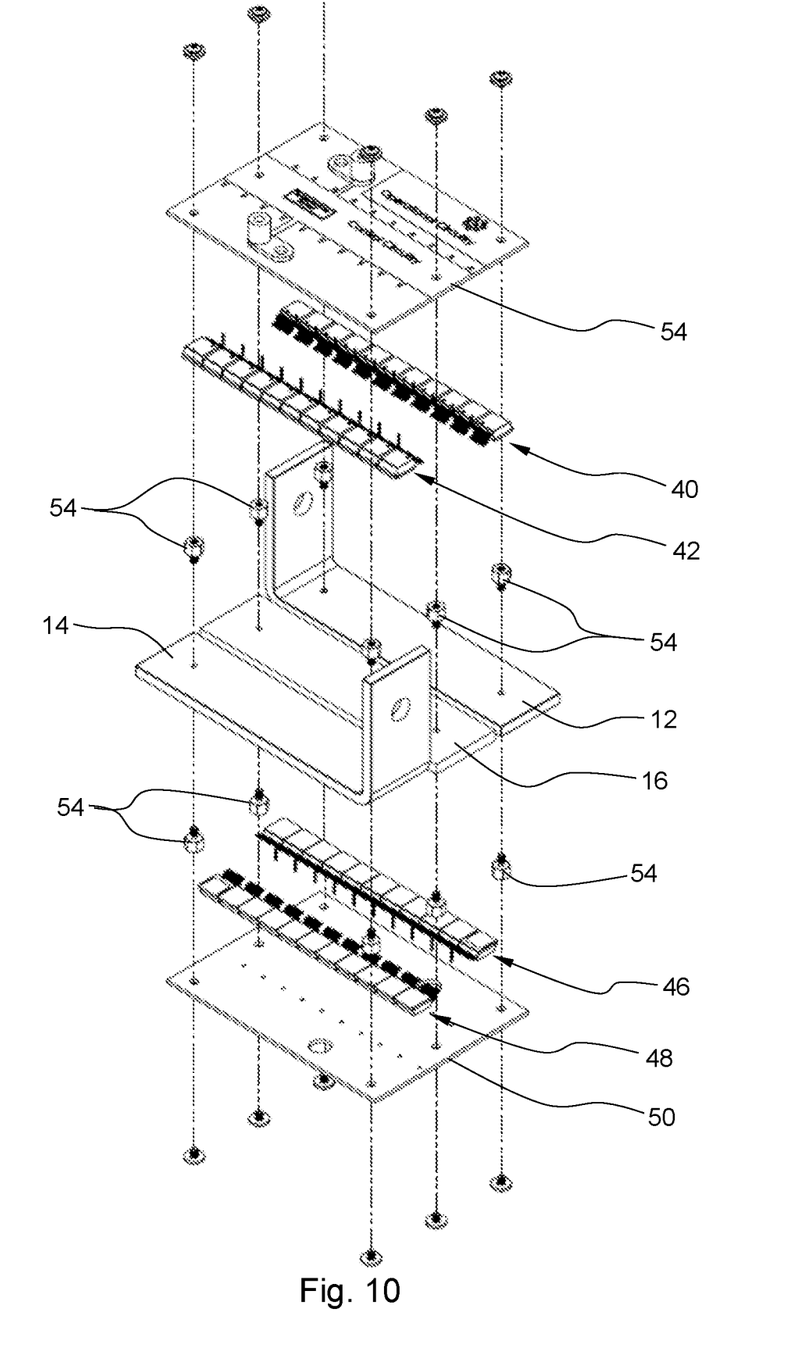
FIG. 10 is an exploded perspective view of the high current, solid-state bidirectional relay assembly shown in FIG. 9.

In an embodiment of the solid-state bidirectional relay shown in FIGS. 9 and 10, a third array 46 of MOSFET switching elements and a fourth array 48 of MOSFET switching elements are connected to the second surfaces 22B, 24B, 26B of the first conductor bar 12, second conductor bar 14, and intermediate conductor bar 16, respectively.

In the embodiment, the source lead 32 of each MOSFET switching element in the third array 46 and fourth array 48 is electrically connected to the second surface 26B of the third intermediate conductor bar 16. That is, the back-to-back MOSFET switching elements share a common source. The drain lead 34 of each MOSFET switching element in the third array 46 is electrically connected to the second surface 22B of the first conductor bar 12, and the drain lead 34 of each MOSFET switching element in the fourth array 48 is electrically connected to the second surface 24B of the second conductor bar 14.

Figure 11:
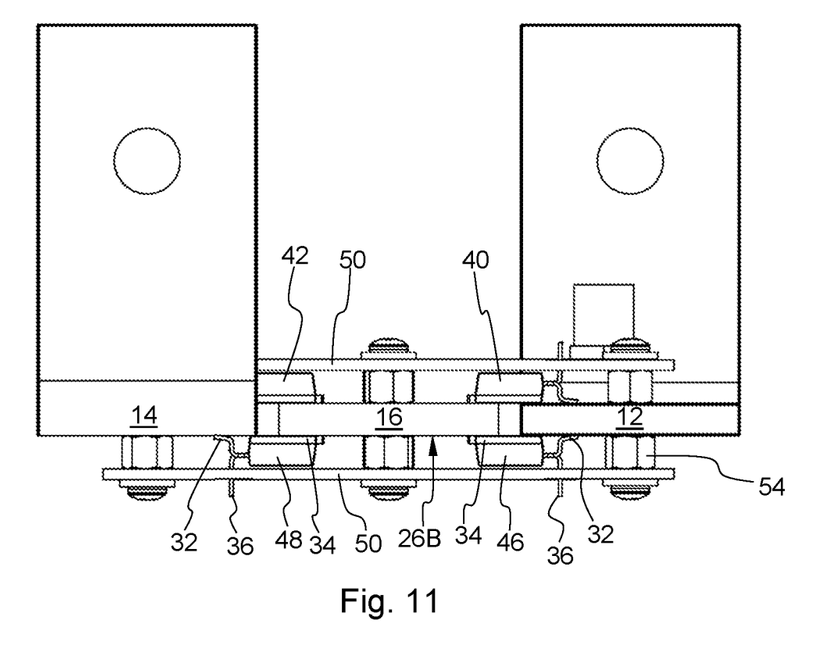
FIG. 11 is a side view showing an alternative back-to-back MOSFET switching element configuration embodiment in a high current, solid-state bidirectional relay assembly having additional arrays of MOSFET switching elements on the bottom surfaces of the conductor bars.

As shown in FIG. 11, it is within the scope of the disclosed invention to provide the solid-state bidirectional relay with a third array 46 and fourth array 48 of back-to-back MOSFET switching elements in which the drain lead 34 of each MOSFET switching element in the third array 46 and fourth array 48 is electrically connected to the second surface 26B of the third intermediate conductor bar 16. That is, the back-to-back MOSFET switching elements share a common drain. The source lead 32 of each MOSFET switching element in the third array 46 is electrically connected to the second surface of the first conductor bar 12, and the source lead 32 of each MOSFET switching element in the fourth array 48 is electrically connected to the second surface of the second conductor bar 14.

Figure 4:
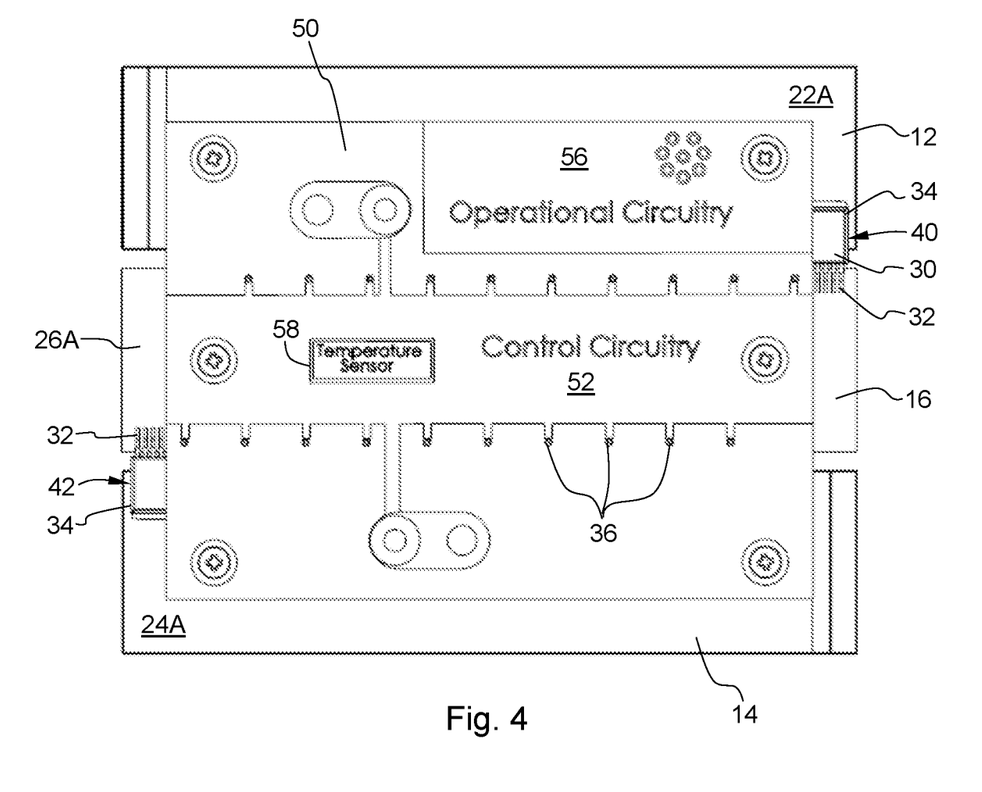
FIG. 4 is a top view of the high current, solid-state bidirectional relay assembly shown in FIG. 1.

One or more disclosed embodiments of the solid-state bidirectional relay 10 include a printed circuit board 50 comprising control circuitry 52 to provide control of the bidirectional relay 10. The gate lead 36 of each MOSFET switching element 30 is electrically connected to the control circuitry 52 of the printed circuit board 50, as shown in FIG. 4.

In one or more disclosed embodiments of the solid-state bidirectional relay, the plurality of MOSFET switching elements 30 are divided between the first array 40 of switching elements and the second array 42 of switching elements. The plurality of MOSFET switching elements 30 are also divided between the third array 46 and fourth array 48 of switching elements. The MOSFET switching elements may be equally divided or unequally divided. The individual MOSFET switching elements may be the same or different.

The number of MOSFET switching elements 30 divides among the arrays of switching elements may vary depending upon the desired continuous current capacity of the solid-state bidirectional relay. The length of the conductor bars may be adjusted to accommodate the number of MOSFET switching elements. As noted above, additional arrays of MOSFET switching elements may be disposed on the second surfaces of the conductor bars.

In one or more non-limiting embodiment, the number of MOSFET switching elements is selected to provide a continuous current capacity in the range of 50 to 1000 amperes. In one or more non-limiting embodiment of the solid-state bidirectional relay, the number of MOSFET switching elements is selected to provide a continuous current capacity in the range of 100 to 500 amperes. In one or more non-limiting embodiments of the solid-state bidirectional relay, the number of MOSFET switching elements is selected to provide a continuous current capacity in the range of 200 to 300 amperes.

One or more embodiments of the solid-state bidirectional relay 10 include standoffs 54 affixed to the first conductor bar 12, the second conductor bar 14, and the intermediate conductor bar 16. The printed circuit board 50 is affixed to the standoffs 54 and spaced from the first conductor bar 12, second conductor bar 14, and third intermediate conductor bar 16.

In one or more non-limiting embodiments of the solid-state bidirectional relay 10, at least one standoff 54 affixed to the first conductor bar 12 is conductive, at least one standoff 54 affixed to the second conductor bar 14 is conductive, and at least one standoff 54 affixed to the intermediate conductor bar 16 is conductive. The printed circuit board 50 may comprise operational circuitry 56 connected to the conductive standoffs to sense a MOSFET voltage drop between the first conductor bar and second conductor bar and to determine a current flow through the bidirectional relay assembly 10.

In the embodiment shown in FIGS. 1, 3, 5, 8-11 the printed circuit board 50 mounts to each conductor bar through two standoffs 54 for support. This allows one standoff 54 to conduct electrical power to the printed circuit board 50. The other standoff may be used to sense the voltage drop across the outside first and second conductor bars 12, 14. The sensed voltage is used to calculate current through the solid-state bidirectional relay 10 without having to use an additional shunt resistor. A temperature sensor 58 senses the internal temperature of the relay. The temperature sensor may be connected to operational circuitry 56 to calculate a MOSFET resistance based on MOSFET temperature. Accurate MOSFET resistance may be used to adjust current measurement due to changing on resistance of the MOSFET switching elements 30.

The total electrical path in the discloses solid-state bidirectional relay assembly includes the first conductor bar 12 and the second conductor bar 14, which provide the external wiring connections, and the third intermediate conductor bar 16, joined by back-to-back MOSFET switching elements. In one or more disclosed embodiments of the solid-state bidirectional relay 10, the first conductor bar 12 comprises a first terminal extension 62 and the second conductor bar 14 comprise a second terminal extension 64. The first and second terminal extensions 62, 64 facilitate connection to an electric power source (not shown), such as a battery or battery charger, or load. The first and second terminal extensions 62, 64 may be at any angle relative to the first and second conductor bars 12, 14. In one non-limiting embodiment, the first terminal extension 62 is disposed at a 90° angle relative to the first conductor bar 12. In one non-limiting embodiment, the second terminal extension 64 is disposed at a 90° angle relative to the second conductor bar 14.

Figure 6:
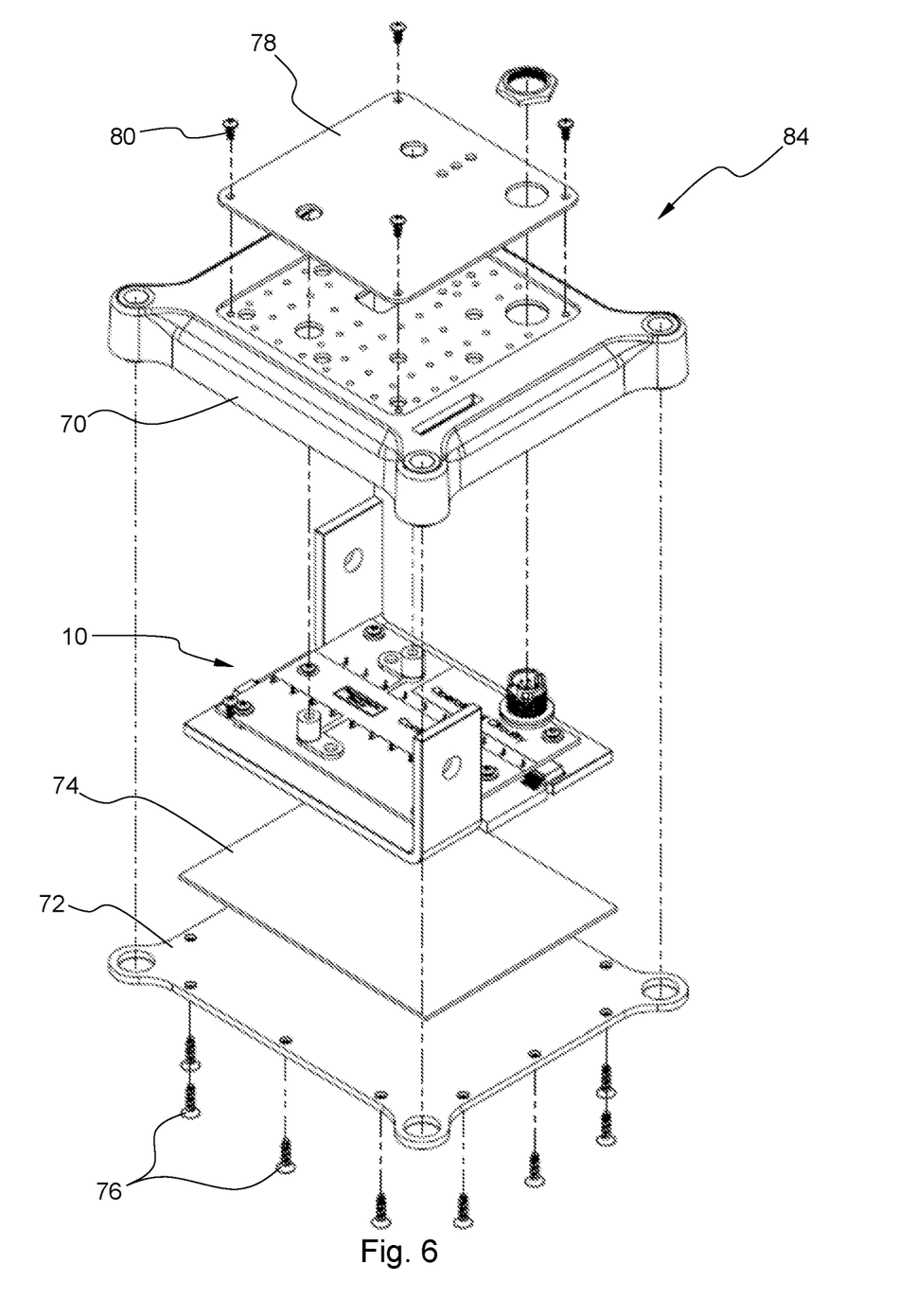
FIG. 6 is an exploded perspective view of the high current, solid-state bidirectional relay assembly shown in FIG. 1 installed in a suitable housing.
Figure 7:
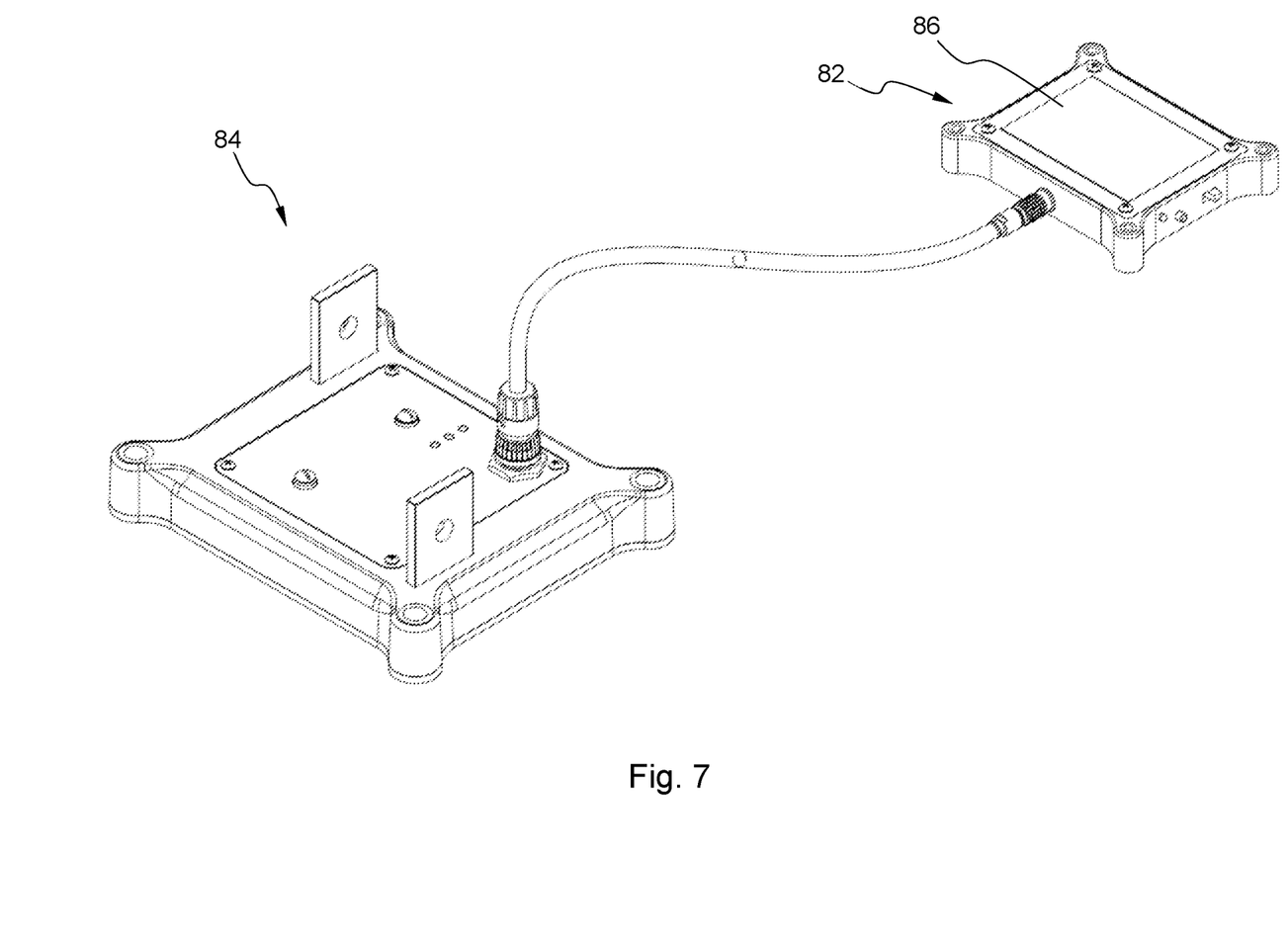
FIG. 7 is a perspective view of a high current, solid-state bidirectional relay assembly connected to a control interface.

The solid-state bidirectional relay 10 is preferably disposed in a protective housing. FIG. 6 shows an exploded perspective view of the solid-state bidirectional relay 10 disposed in a case 70 having a bottom plate 72. An insulator 74 is disposed between the conductor bars 12, 14, 16 and the bottom plate 72. A plurality of fasteners 76 are provided to attach the bottom plate 72 to the case 70. A top plate 78 is also provided. A plurality of fasteners 80 are provided to attach the top plate 78 to the case 70. The top plate 78 may include electrical receptors to facilitate attachment of a control interface 82, shown in FIG. 7. Lights or other visual indicators may be provided on the top plate 78 to indicate operation status One or more disclosed embodiments of the solid-state bidirectional relay include a control interface. FIG. 7 shows solid-state bidirectional relay assembly within a housing 84. A control interface 82 is shown electrically connected to the solid-state bidirectional relay assembly 84. The electrical connection may be hardwired or wireless. The control interface 82 may comprise a remote display 86 to visually present information regarding operation of the bidirectional relay assembly. The control interface 82 may comprise a user input connected to the control circuitry to control operation of the bidirectional relay 84.

In summary, the back-to-back MOSFET switching elements share either a common source or a common drain. They straddle three, electrically isolated conductor bars as shown in FIGS. 1, 3, 5, and 8-11. The outer first and second conductor bars 12, 14 are the connection points to outside electrical sources, such as batteries, chargers, and loads. These outer conductor bars connect to either the source or drain of each back-to-back MOSFET switching element. The gate leads of each MOSFET switching elements is bent vertically (FIG. 2) from the rest of the source pins 38. The vertical gate leads protrude through holes in the printed circuit board 50 and are soldered to the control circuitry on the printed circuit board 50. The standoffs 54 and soldered gate leads 36 create a rigid structure holding the printed circuit board 50 and the three conductor bars 12, 14, 16 with soldered MOSFET switching elements 30 together.

The standoffs 54 allow the control circuitry on the printed circuit board 50 to sense the voltages on the drains and sources of all parallel back-to-back MOSFET switching element structures. The embodiment shown in FIG. 5 uses 10 back-to-back pairs of MOSFET switching elements (20 total MOSFET switching elements) to obtain high-current operation. If more current is needed, additional MOSFET switching elements 30 are added in parallel either by extending the three conductor bars 12, 14, 16 or soldering switching elements to both first and second surfaces of the conductor bars. When additional arrays of MOSFET switching elements are mirrored on the bottom side of the conductor bars, as shown in FIGS. 9-11, the same or similar control circuitry on another printed circuit board 50 may be connected to the gate leads 36 of the bottom MOSFET switching elements. Thus, the printed circuit boards 50 serve to distribute the gate signal to all the gate leads 36 of the MOSFET switching elements 30 on the top and bottom surfaces of the conductor bars 12, 14, 16. The back-to-back MOSFET switching element relay, when turned on, conducts current through the back-to-back MOSFET structure using the three conductor bar current path.

The disclosed high current solid-state bidirectional relay may be advantageously used in an automotive environment for isolating batteries or other high current electrical sources. One expected use is to combine batteries for jumpstarting the main battery or to provide additional power for automotive loads.

The disclosed solid-state bidirectional relay uses a separate low-resistance path for the back-to-back relay. This allows for easy symmetrical or equal current flow in each back-to-back structure.

The disclosed solid-state bidirectional relay can duplicate the arrays of back-to-back MOSFET switching elements on the bottom side and control them using the same exact printed circuit board control circuitry.

The disclosed high current solid-state bidirectional relay allows for a cheaper control printed circuit board to be used while keeping high-current noise from interfering with close proximity to sensitive electronic components. Additionally, the disclosed invention provides the lowest resistance path between the back-to-back MOSFET switching elements.

The disclosed high current solid-state bidirectional relay includes an intermediate third conductor bar to facilitate the electrical connection for the back-to-back MOSFET switching element. By using the third intermediate conductor bar to create the electrical connection, a specialized heavy copper cladded/copper laminated printed circuit board for electrical connection is not required. This enables the use of a less expensive relay control printed circuit board and provides an extremely low resistance current path, which is ideal for high current applications.

All examples and conditional language recited herein are intended for pedagogical objects to aid the reader in understanding the invention and the concepts contributed by the inventor to furthering the art, and are to be construed as being without limitation to such specifically recited examples and conditions. While specific embodiments and examples of the present invention have been illustrated and described, numerous modifications come to mind without significantly departing from the spirit of the invention, and the scope of protection is only limited by the scope of the accompanying claims.

The invention claimed is:

1. A high current bidirectional relay assembly comprising:
a first conductor bar having a first surface and an opposite second surface;
a second conductor bar having a first surface and an opposite second surface;
a third intermediate conductor bar having a first surface and an opposite second surface;
a plurality of metal oxide semiconductor field effect transistor (MOSFET) switching elements disposed in a first array of switching elements and a second array of switching elements, wherein each MOSFET switching element comprises a source lead, a drain lead, and a gate lead,
wherein the source lead of each MOSFET switching element in the first array and second array is electrically connected to the first surface of the third intermediate conductor bar, the drain lead of each MOSFET switching element in the first array is electrically connected to the first surface of the first conductor bar, and the drain lead of each MOSFET switching element in the second array is electrically connected to the first surface of the second conductor bar, or
wherein the drain lead of each MOSFET switching element in the first array and second array is electrically connected to the first surface of the third intermediate conductor bar, the source lead of each MOSFET switching element in the first array is electrically connected to the first surface of the first conductor bar, and the source lead of each MOSFET switching element in the second array is electrically connected to the first surface of the second conductor bar; and
a printed circuit board comprising control circuitry to provide control of the bidirectional relay assembly, wherein the gate lead of each MOSFET switching element is electrically connected to the control circuitry of the printed circuit board.

2. The high current bidirectional relay assembly according to claim 1, wherein the first conductor bar, the second conductor bar, and the third intermediate conductor bar are disposed in a substantially coplanar configuration with the third intermediate conductor bar disposed between the first conductor bar and the second conductor bar.

3. The high current bidirectional relay assembly according to claim 1, wherein the first conductor bar, the second conductor bar, and the third intermediate conductor bar are fabricated of a conductive metallic material.

4. The high current bidirectional relay assembly according to claim 3, wherein the conductive metallic material is selected from copper, brass, bronze, nickel, magnesium, silver, platinum, gold, zinc or aluminum.

5. The high current bidirectional relay assembly according to claim 1, wherein the plurality of MOSFET switching elements are divided between the first array of switching elements and the second array of switching elements.

6. The high current bidirectional relay assembly according to claim 1, wherein the plurality of MOSFET switching elements are equally divided between the first array of switching elements and the second array of switching elements.

7. The high current bidirectional relay assembly according to claim 1, wherein the number of MOSFET switching elements is selected to provide a continuous current capacity in the range of 50 to 1000 amperes.

8. The high current bidirectional relay assembly according to claim 1, wherein the number of MOSFET switching elements is selected to provide a continuous current capacity in the range of 100 to 500 amperes.

9. The high current bidirectional relay assembly according to claim 1, wherein the number of MOSFET switching elements is selected to provide a continuous current capacity in the range of 200 to 300 amperes.

10. The high current bidirectional relay assembly according to claim 1, further comprising a third array of MOSFET switching elements and a fourth array of MOSFET switching elements, wherein each MOSFET switching element comprises a source lead, a drain lead, and a gate lead, wherein the source lead of each MOSFET switching element in the third array and fourth array is electrically connected to the second surface of the third intermediate conductor bar, wherein the drain lead of each MOSFET switching element in the third array is electrically connected to the second surface of the first conductor bar, wherein the drain lead of each MOSFET switching element in the fourth array is electrically connected to the second surface of the second conductor bar.

11. The high current bidirectional relay assembly according to claim 1, further comprising a third array of MOSFET switching elements and a fourth array of MOSFET switching elements, wherein each MOSFET switching element comprises a source lead, a drain lead, and a gate lead, wherein the drain lead of each MOSFET switching element in the third array and fourth array is electrically connected to the second surface of the third intermediate conductor bar, the source lead of each MOSFET switching element in the third array is electrically connected to the second surface of the first conductor bar, and the source lead of each MOSFET switching element in the fourth array is electrically connected to the second surface of the second conductor bar.

12. The high current bidirectional relay assembly according to claim 1, further comprising standoffs affixed to the first conductor bar, the second conductor bar, and the intermediate conductor bar, wherein the printed circuit board is affixed to the standoffs.

13. The high current bidirectional relay assembly according to claim 9, wherein at least one standoff affixed to the first conductor bar is conductive, at least one standoff affixed to the second conductor bar is conductive, and at least one standoff affixed to the intermediate conductor bar is conductive, and wherein the printed circuit board comprises operational circuitry connected to the conductive standoffs to sense a MOSFET voltage drop between the first conductor bar and second conductor bar and to determine a current flow through the bidirectional relay assembly.

14. The high current bidirectional relay assembly according to claim 1, wherein the first conductor bar comprises a first terminal extension and the second conductor bar comprises a second terminal extension, wherein the first and second terminal extensions facilitate connection to an electric power source.

15. The high current bidirectional relay assembly according to claim 10, wherein the first terminal extension is disposed at a 90° angle relative to the first conductor bar.

16. The high current bidirectional relay assembly according to claim 10, wherein the second terminal extension is disposed at a 90° angle relative to the second conductor bar.

17. The high current bidirectional relay assembly according to claim 1, further comprising a temperature sensor to sense a temperature of the plurality of MOSFETs is connected to the operational circuitry to calculate a MOSFET resistance based on MOSFET temperature.

18. The high current bidirectional relay assembly according to claim 1, further comprising a control interface connected to the printed circuit board, wherein the control interface comprises:
   a remote display to visually present information regarding operation of the bidirectional relay assembly; and
   a user input connected to the control circuitry to control operation of the bidirectional relay assembly.

19. A high current bidirectional relay assembly comprising:
   a first conductor bar having a first surface and an opposite second surface;
   a second conductor bar having a first surface and an opposite second surface;
   a third intermediate conductor bar having a first surface and an opposite second surface, wherein the first conductor bar, the second conductor bar, and the third intermediate conductor bar are disposed in a substantially coplanar configuration with the third intermediate conductor bar disposed between the first conductor bar and the second conductor bar, wherein the first conductor bar, the second conductor bar, and the third intermediate conductor bar are fabricated of a conductive metallic material;
   a plurality of metal oxide semiconductor field effect transistor (MOSFET) switching elements disposed in a first array of switching elements and a second array of switching elements, wherein the number of MOSFET switching elements is selected to provide a continuous current capacity in the range of 50 to 500 amperes, wherein each MOSFET switching element comprises a source lead, a drain lead, and a gate lead,
      wherein the source lead of each MOSFET switching element in the first array and second array is electrically connected to the first surface of the third intermediate conductor bar, the drain lead of each MOSFET switching element in the first array is electrically connected to the first surface of the first conductor bar, and the drain lead of each MOSFET switching element in the second array is electrically connected to the first surface of the second conductor bar, or wherein the drain lead of each MOSFET switching element in the first array and second array is electrically connected to the first surface of the third intermediate conductor bar, the source lead of each MOSFET switching element in the first array is electrically connected to the first surface of the first conductor bar, and the source lead of each MOSFET switching element in the second array is electrically connected to the first surface of the second conductor bar;

a printed circuit board comprising control circuitry to provide control of the bidirectional relay assembly, wherein the gate lead of each MOSFET switching element is electrically connected to the control circuitry of the printed circuit board; and standoffs affixed to the first conductor bar, the second conductor bar, and the intermediate conductor bar, wherein the printed circuit board is affixed to the standoffs.

20. The high current bidirectional relay assembly according to claim 19, wherein at least one standoff affixed to the first conductor bar is conductive, at least one standoff affixed to the second conductor bar is conductive, and at least one standoff affixed to the intermediate conductor bar is conductive, and wherein the printed circuit board comprises operational circuitry connected to the conductive standoffs to sense a MOSFET voltage drop between the first conductor bar and second conductor bar and to determine a current flow through the bidirectional relay assembly.

* * * * *